United States Patent
Leeser

(10) Patent No.: US 10,143,993 B2
(45) Date of Patent: Dec. 4, 2018

(54) RADICAL GENERATOR AND METHOD FOR GENERATING AMMONIA RADICALS

(71) Applicant: Lam Research Corporation, Fremont, CA (US)

(72) Inventor: Karl Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 414 days.

(21) Appl. No.: 14/918,510

(22) Filed: Oct. 20, 2015

(65) Prior Publication Data

US 2017/0050164 A1    Feb. 23, 2017

Related U.S. Application Data

(60) Provisional application No. 62/206,773, filed on Aug. 18, 2015.

(51) Int. Cl.
    *B01J 19/12*    (2006.01)

(52) U.S. Cl.
    CPC ...... *B01J 19/123* (2013.01); *B01J 2219/0801* (2013.01); *B01J 2219/0871* (2013.01); *B01J 2219/0875* (2013.01); *B01J 2219/1203* (2013.01)

(58) Field of Classification Search
    CPC .............. B01J 19/123; B01J 2219/0801; B01J 2219/1203; B01J 2219/0871; B01J 2219/0875; B01J 2219/087
    USPC ........ 204/157.15, 157.44, 157.63; 422/186.3
    See application file for complete search history.

(56) References Cited

U.S. PATENT DOCUMENTS

| | | | | |
|---|---|---|---|---|
| 3,554,887 A | * | 1/1971 | Feehs | B01J 19/123 204/157.15 |
| 3,748,243 A | * | 7/1973 | Christianes et al. | B01J 19/123 204/157.94 |
| 3,769,517 A | * | 10/1973 | Coleman | B01J 19/123 250/455.11 |
| 4,435,445 A | * | 3/1984 | Allred | C23C 16/047 136/258 |
| 4,588,610 A | * | 5/1986 | Yamazaki | C23C 16/345 257/E21.293 |

(Continued)

*Primary Examiner* — Nicholas A Smith
*Assistant Examiner* — Colleen M Raphael
(74) *Attorney, Agent, or Firm* — Martine Penilla Group, LLP

(57) ABSTRACT

A generator for processing gases to be delivered to a process chamber used to process a substrate includes a housing that encloses an internal volume. An ultraviolet (UV) bulb is disposed within the internal volume of the housing. The UV bulb has a bulb diameter that fits within the internal major dimension of the housing. A first region, which surrounds the UV bulb, channels a first gas around the UV bulb to cool the UV bulb. A second region, which surrounds the first region, channels a second gas between an input to and an output from the housing. The second region is oriented relative to the UV bulb such that UV energy therefrom interacts with the second gas as this gas flows through the second region. The interaction of the UV energy with the second gas results in the generation of a gas mix that is supplied from the output of the housing into the process chamber, where at least one component of the gas mix is to be used in processing of the semiconductor substrate.

23 Claims, 6 Drawing Sheets

(56) References Cited

U.S. PATENT DOCUMENTS

| | | | | |
|---|---|---|---|---|
| 4,702,936 | A * | 10/1987 | Maeda | C23C 16/308 |
| | | | | 427/583 |
| 4,995,955 | A * | 2/1991 | Kim | B01D 53/60 |
| | | | | 204/157.2 |
| 5,372,781 | A * | 12/1994 | Hallett | A61L 2/10 |
| | | | | 422/186 |
| 6,461,520 | B1 * | 10/2002 | Engelhard | C02F 1/325 |
| | | | | 210/138 |
| 7,391,041 | B2 * | 6/2008 | Sajo | A61L 9/20 |
| | | | | 210/138 |
| 7,858,510 | B1 * | 12/2010 | Banerji | C23C 16/0227 |
| | | | | 257/E21.269 |
| 8,405,046 | B2 * | 3/2013 | NeCamp | C02F 1/325 |
| | | | | 210/748.01 |
| 8,834,789 | B2 * | 9/2014 | Schiene | C02F 1/325 |
| | | | | 422/22 |
| 2002/0175067 | A1 * | 11/2002 | Sherwood | C07C 2/00 |
| | | | | 204/157.15 |
| 2006/0057799 | A1 * | 3/2006 | Horiguchi | H01L 21/67115 |
| | | | | 438/200 |
| 2007/0246176 | A1 * | 10/2007 | Miyawaki | D21C 9/1005 |
| | | | | 162/9 |
| 2008/0078987 | A1 * | 4/2008 | Leusink | H01L 29/518 |
| | | | | 257/19 |
| 2010/0075507 | A1 * | 3/2010 | Chang | C23C 16/0272 |
| | | | | 438/763 |
| 2014/0159244 | A1 * | 6/2014 | Lu | H01L 21/76885 |
| | | | | 257/773 |

* cited by examiner

RADICAL GENERATOR AND METHOD FOR GENERATING AMMONIA RADICALS

CLAIM OF PRIORITY

This application claims priority under 35 U.S.C. § 119(e) to U.S. Provisional Patent Application No. 62/206,773, filed Aug. 18, 2015, the disclosure of which is incorporated by reference herein in its entirety for all purposes.

BACKGROUND

In various semiconductor processes, activated ammonia radicals (NH*) are used for reaction chemistry. Certain classes of reactions require generation of ammonia radicals at low energy without creating hydrogen ions or radicals.

Many processes leverage plasma resources to generate ammonia radicals, with inductively coupled plasma (ICP) sources being the most common. ICP sources are physically large, complex, and expensive. These sources typically require dilution with a plasma feedgas that enables low pressure ionization and therefore operation, but competes with radical generation efficiency. Most importantly, however, substantial ion flux at relatively high ion energy is generated that is damaging to low-k dielectric substrates.

Further, ultraviolet (UV) sources typically consume large amounts of electrical power to do useful work. Much of this power is wasted in the parasitic production of ozone in the atmospheric air surrounding the UV source assemblies. The parasitic production of ozone is typically caused because dielectric windows used in ICP chambers are transparent to UV energy, which then gets absorbed by atmospheric oxygen and thus produces parasitic ozone. As such, the radical generation using ICP sources is not efficient.

It is in this context that embodiments arise.

SUMMARY

In an example embodiment, a generator for processing gases to be delivered to a process chamber used to process a semiconductor substrate is provided. The generator includes a housing that encloses an internal volume, with the housing having a length and an internal major dimension. An ultraviolet (UV) bulb is disposed within the internal volume of the housing and extends along the length of the housing. The UV bulb has a bulb diameter that fits within the internal major dimension of the housing. A first region surrounds the UV bulb, with the first region being defined to channel a first gas around the UV bulb to control a temperature of the UV bulb. A second region surrounds the first region, with the second region extending along the length of the housing and within the internal major dimension of the housing. The second region, which is configured to channel a second gas between an input to the housing and an output from the housing, is oriented relative to the UV bulb such that UV energy from the UV bulb interacts with the second gas as the second gas flows through the second region. The interaction of the UV energy with the second gas results in the generation of a gas mix that is supplied from the output of the housing into the process chamber, where at least one component of the gas mix is to be used in processing of the semiconductor substrate.

In one embodiment, the first region is defined between a surface of the UV bulb and a separator wall. In one embodiment, the second region is defined between the separator wall and an inner surface of a housing wall. In one embodiment, the separator wall is formed of a material that is substantially transparent to UV energy such as, for example, quartz. In one embodiment, the inner surface of the housing wall is a reflective surface.

In one embodiment, the first gas is a cooling gas and the second gas is ammonia. In one embodiment, the cooling gas is dry nitrogen. In one embodiment, the interaction of the UV energy with ammonia results in a gas mix including activated ammonia radicals (NH*).

In one embodiment, the housing of the generator is disposed on a lid of the process chamber such that a path is defined from the output of the housing to a processing region of the process chamber. In one embodiment, the generator further includes a lamp controller that is coupled to the housing and connected to the UV bulb. The lamp controller provides operational control of the UV bulb in response to instruction received from a controller.

In one embodiment, the internal major dimension of the housing is a diameter defined by an inner surface of a housing wall. In this example, the UV energy radiates away from a central axis of the UV bulb in axisymmetric fashion toward the inner surface of the housing wall, and a circle defined by the inner surface of the housing wall has a central axis that is the same as the central axis of the UV bulb.

In another example embodiment, a method is provided. The method includes generating ultraviolet (UV) energy that emanates from an axisymmetric UV bulb. The method further includes flowing a cooling gas through a cooling tube that surrounds the axisymmetric UV bulb, and flowing ammonia gas through an outer tube that surrounds the cooling tube, with the outer tube being coaxial with the axisymmetric UV bulb. Next, the method includes directing into a chamber activated ammonia radicals resulting from the interaction of the UV energy with the ammonia gas.

In one embodiment, the cooling tube is substantially transparent to UV energy. In one embodiment, the cooling tube is comprised of quartz. In one embodiment, the cooling gas is dry nitrogen. In one embodiment, the method further includes reflecting UV energy that reaches an inner surface of the outer tube back into the flowing ammonia gas.

In an alternative embodiment, a generator for processing gases to be delivered to a process chamber used to process a semiconductor substrate is provided. The generator includes a housing enclosing an internal volume. The housing has a first dimension and an internal dimension. An ultraviolet (UV) bulb is disposed within the internal volume of the housing and extends along the first dimension of the housing. The UV bulb has a bulb diameter that fits within the internal dimension of the housing. A region surrounding the UV bulb extends along the first dimension of the housing and within the internal dimension of the housing. The region is configured to channel a gas between an input to the housing and an output from the housing. The region is oriented relative to the UV bulb such that UV energy from the UV bulb interacts with the gas as the gas flows through the region. The interaction of the UV energy with the gas results in the generation of a gas mix that is supplied from the output of the housing into the process chamber. At least one component of the gas mix is to be used in processing of the semiconductor substrate.

Other aspects and advantages of the disclosures herein will become apparent from the following detailed description, taken in conjunction with the accompanying drawings, which illustrate by way of example the principles of the disclosures.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, process operations and implementation details have not been described in detail, if already well known.

In the following embodiments, an activated ammonia radical (NH*) generator is disclosed. The generator has a coaxial geometry in which a high power ultraviolet (UV) bulb, which is centrally disposed in the generator, is surrounded by a flow of ammonia gas. The method of ammonia radical generation implemented in the disclosed generator is targeted at breaking the ammonia specifically into ammonia radicals (NH*) and hydrogen ($H_2$). The disclosed generator is extremely efficient because almost all of the UV energy is absorbed by the ammonia gas rather than being absorbed by ozone generation in atmospheric air (as is the case when plasma sources are leveraged to generate ammonia radicals). This efficiency reduces system complexity and electrical power consumption and thereby reduces operating costs. Furthermore, by avoiding the generation of ozone from atmospheric oxygen, the disclosed generator eliminates the need to deal with high exhaust flows as well as other challenges typically associated with ozone abatement.

Figure 1:
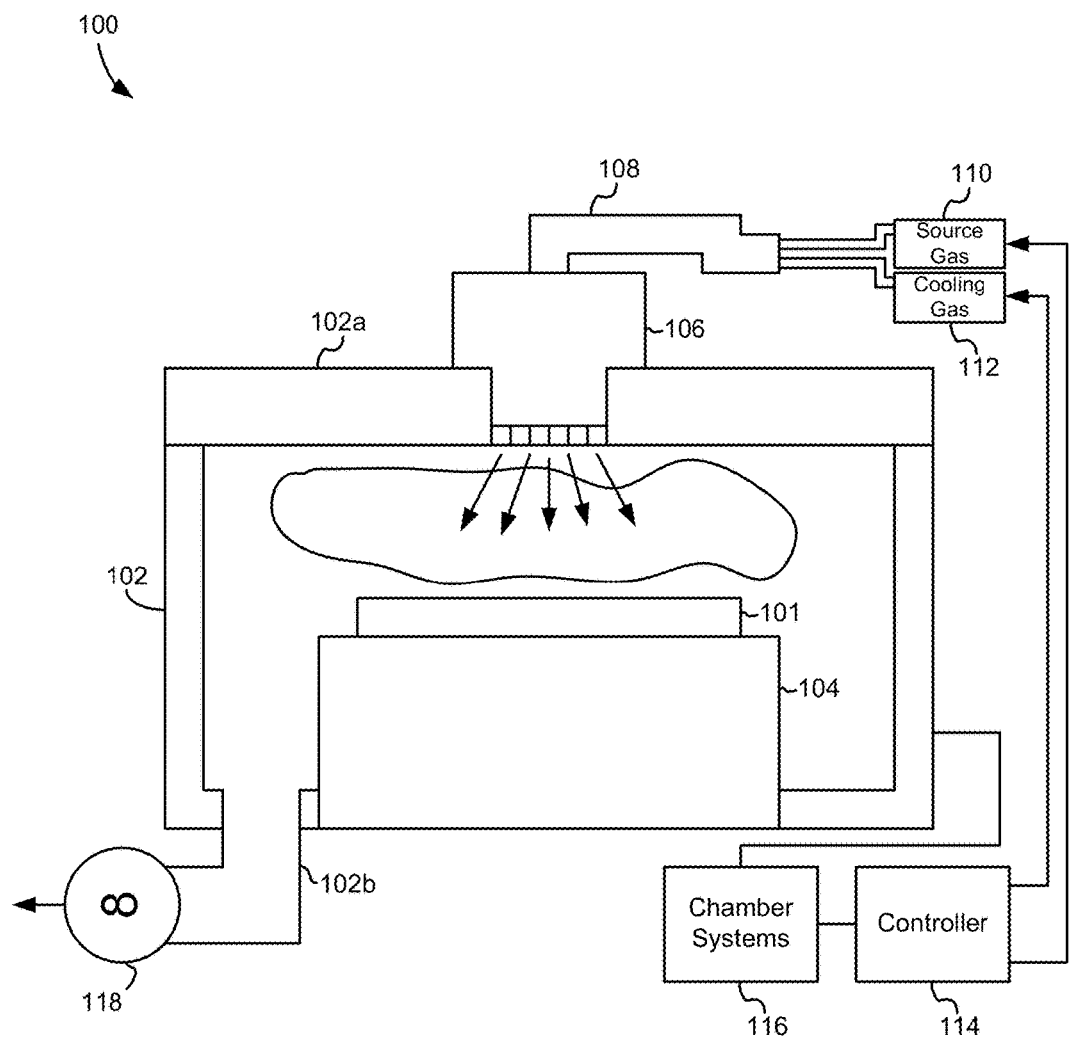
FIG. 1 is a simplified schematic diagram that illustrates a substrate processing system used to process a substrate, in accordance with an example embodiment.

FIG. 1 is a simplified schematic diagram that illustrates a substrate processing system 100, which is used to process a substrate 101. In one embodiment, the substrate is a silicon wafer. The system includes a chamber 102 having a chamber lid 102a. Substrate support 104, which is disposed on the bottom of chamber 102, provides support for substrate 101. Depending upon the processing being performed, and by way of example, the substrate support 104 can be a pedestal or an electrostatic chuck (ESC). It will be appreciated by those skilled in the art that the substrate support 104 can be provided with edge rings or carrier rings (not shown) to meet the needs of specific processing applications.

As shown in FIG. 1, ammonia radical generator 106 is disposed on chamber lid 102a of chamber 102. Ammonia radical generator 106 is coupled in flow communication with gas manifold 108, which receives source gas from gas source 110 and cooling gas from gas source 112. Each of gas sources 110 and 112 can be connected in flow communication with an appropriate gas facility. Ammonia radical generator 106 generates ammonia radicals which flow into the processing region of chamber 102. Additional details regarding the operation of ammonia radical generator 106 are set forth below with reference to FIGS. 2 and 3. It will be appreciated by those skilled in the art that, in addition to the ammonia radicals, other process gases (not shown) can be flowed into the chamber 102 to meet the needs of specific processing applications. In the case where other process gases are used, chamber 102 will need to be provided with appropriate valving and mass flow control mechanisms to ensure that the correct gases are delivered during processing.

Substrate processing system 100 also includes controller 114, which is configured to control operation of the substrate processing system. By way of example, controller 114 can execute process recipes, such as power levels, timing parameters, process gases, mechanical movement of the substrate 101, etc., to deposit or form films over the substrate. As shown in FIG. 1, controller 114 is coupled to chamber systems 116, gas source 110, and gas source 112. Chamber systems 116 can include various facilities and parameters associated with operation of the system 100 including, by way of example, power supplies, process gases, voltages, currents, temperatures, and pressures. Gas sources 110 and 112 are controlled to ensure proper operation of the ammonia radical generator 106 and thereby the introduction of the desired amount of ammonia radicals into the processing region of chamber 102.

Any ammonia radicals and process gases not consumed during processing exit the chamber 102 via a suitable outlet 102b. A vacuum pump 118 (e.g., a one or two stage mechanical dry pump and/or a turbomolecular pump) draws the ammonia radicals and process gases out and maintains a suitably low pressure within the chamber 102 by a closed loop controlled flow restriction device, such as a throttle valve or a pendulum valve.

Figure 2:
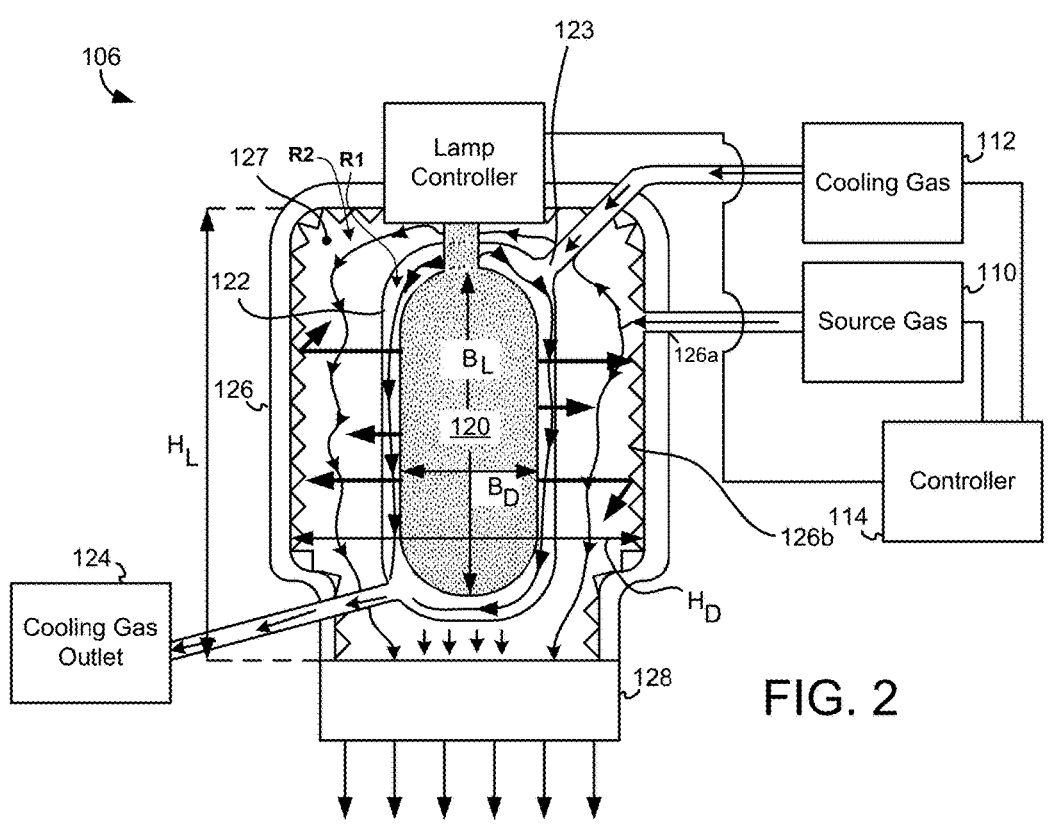
FIG. 2 is a simplified schematic diagram that illustrates additional details of the ammonia radical generator shown in FIG. 1, in accordance with an example embodiment.

FIG. 2 is a simplified schematic diagram that illustrates additional details of ammonia radical generator 106 shown in FIG. 1, in accordance with an example embodiment. As shown in FIG. 2, ammonia radical generator 106 includes a high power ultraviolet (UV) bulb 120 centrally disposed in the ammonia radical generator. The UV bulb 120 has a bulb length $B_L$ and a bulb diameter $B_D$. In one embodiment, the UV bulb 120 has a cylindrical configuration that is symmetrical around a central axis that runs along the length of the UV bulb. With this configuration, the UV bulb 120 emits optical energy axisymmetrically. The UV bulb 120 can be any suitable commercially available UV bulb, e.g., a filament-based bulb or a fluorescent (mercury-type) bulb. The UV bulb 120 can be powered by any suitable source of power, for example, direct current (DC) electrical power or alternating current (AC) electrical power. By way of example, the AC electrical power can be radio frequency (RF) power or microwave power. Lamp controller 121, which is connected to controller 114, controls the operation of the UV bulb 120, e.g., power, on/off state, etc.

The UV bulb 120 is surrounded by a separator wall 122 that is formed of a solid material that is transparent to UV energy. In one embodiment, the separator wall 122 is formed of quartz. In this example, the quartz must be able to transmit to UV-C (shortwave UV) wavelengths of 200 nanometers to 254 nanometers. In one embodiment, the separator wall 122 has a cylindrical configuration that defines a cooling tube that surrounds the UV bulb 120 and enables cooling gas to flow through the region defined therebetween. The cooling gas acts to cool the surface 120a of the UV bulb 120. In one embodiment, the cooling gas is dry nitrogen. The use of dry nitrogen is preferred relative to dry air because nitrogen molecular bonds do not break selectively at the UV frequencies typically used in the ammonia radical generator 106. In one embodiment, the UV bulb 120 emits UV energy having a wavelength of approximately 220 nanometers. In another embodiment, the UV energy has a wavelength in the range from 200 nanometers to 254 nanometers. At this frequency (or range of frequencies), the nitrogen cooling gas does not absorb any significant amount of UV and, consequently, the UV energy emitted by UV bulb 120 passes right through the curtain of cooling gas without incurring any significant energy loss.

In some embodiments, other UV frequencies can be used, depending on the gas being processed. For instance, for gases other than ammonia, it is envisioned that the UV frequency would be selected specifically for that gas to enable efficient targeting of specific chemical bonds in the molecule(s) of the gas to be processed. Consequently, it should be understood that the frequency and/or frequency ranges mentioned for generation of ammonia radicals are simply exemplary for ammonia gases. Additionally, the UV frequency can also be selected or adjusted based on the inert gas used for cooling, if cooling is implemented in a radical generator. For example, frequencies can be selected to avoid or reduce absorption by said inert gases used for cooling.

As shown in FIG. 2, the cooling gas flows from gas source 112 into the region defined between the inner surface of separator wall 122 and the surface 120a of UV bulb 120 through inlet 123. As the cooling gas flows along the surface 120a of the UV bulb 120, the cooling gas absorbs heat from the surface of the UV bulb and thereby controls the temperature of the UV bulb. In this regard, the flow rate of the cooling gas can be scaled up or down depending upon the size of the UV bulb 120. In one embodiment, the cooling gas provides sufficient cooling to handle a thermal load of at least 21 W/cm$^2$. After passing over the length of the UV bulb 120, the cooling gas exits the ammonia radical generator 106 via cooling gas outlet 124.

The separator wall 122 is surrounded by housing 126, which may be formed of any suitable solid material. In one embodiment, the housing 126 is formed of stainless steel. The housing 126, which has a length $H_L$ and an inner major dimension $H_M$, encloses an inner volume 127. The length HL and the inner major dimension HM of the housing 126 are selected so that the size of the housing is sufficiently large to accommodate the UV bulb 120. The housing 126 is coaxially aligned with the UV bulb 120 and surrounds the separator wall 122 so that a region is defined between the housing and the separator wall. In one embodiment, this region is a cylindrical plenum. The source gas flows from gas source 110 and enters the region, e.g., a cylindrical plenum, defined between housing 126 and separator wall 122. In one embodiment, the source gas is ammonia ($NH_3$). In one embodiment, the source gas is introduced into inlet 126a of housing 126 and is circumferentially distributed by a distribution plenum that guides the source gas into the cylindrical plenum. Once in the cylindrical plenum, the source gas flows past the surface 120a of UV bulb 120 and exits the generator 106 through outlet 128, which includes a suitable number of holes through which the source gas can flow.

One advantage of the ammonia generator 106 is that the configuration of the generator is extremely compact, which makes the generator easy to fit into reactor designs, singly or as part of an array. In one embodiment, the length $H_L$ of housing 126 is in the range of from 152.4 mm to 228.6 mm and the diameter of the outlet 128 is in the range of from 50.8 mm to 101.6 mm. It will be appreciated by those skilled in the art that these dimensions can be varied to meet the need of specific applications.

In operation, UV energy emanates from UV bulb 120 and passes through the cooling gas (e.g., nitrogen) and the separator wall 122 (made of, for example, quartz) into the region, e.g., a cylindrical plenum, defined between the housing 126 and the separator wall. The source gas (e.g., ammonia) flowing through this region interacts with and absorbs UV energy and breaks up into smaller compounds. In the case of ammonia, the UV energy breaks the ammonia into a gas mix of ammonia radicals (NH*) and diatomic hydrogen ($H_2$). This gas mix (ammonia radicals and hydrogen) then exits the generator 106 through the outlet 128 and flows to a downstream region of interest, e.g., a processing region of a chamber (see, for example, chamber 102 shown in FIG. 1).

As a portion of the UV energy may not be absorbed by the ammonia, the inner surface 126b of the housing 126 reflects UV energy back into the stream of ammonia gas. In this manner, the unabsorbed UV energy is passed through the ammonia gas stream for a second time. In one embodiment, the inner surface 126b of the housing 126 is rendered reflective by subjecting the inner surface to an appropriate surface finishing treatment. In another embodiment, a reflective coating material is provided on the inner surface 126b. In one embodiment, the reflective coating material is formulated to reflect UV energy (e.g., UV-C (shortwave UV) having a wavelength of approximately 220 nanometers) back toward the separator wall 122. Notwithstanding the reflective inner surface 126b of the housing 126, some portion of the UV energy that reaches the inner surface may be absorbed by the housing wall. If the power associated with the UV energy is high enough, it may be necessary to cool the housing 126 with, for example, dry nitrogen.

Figure 3:
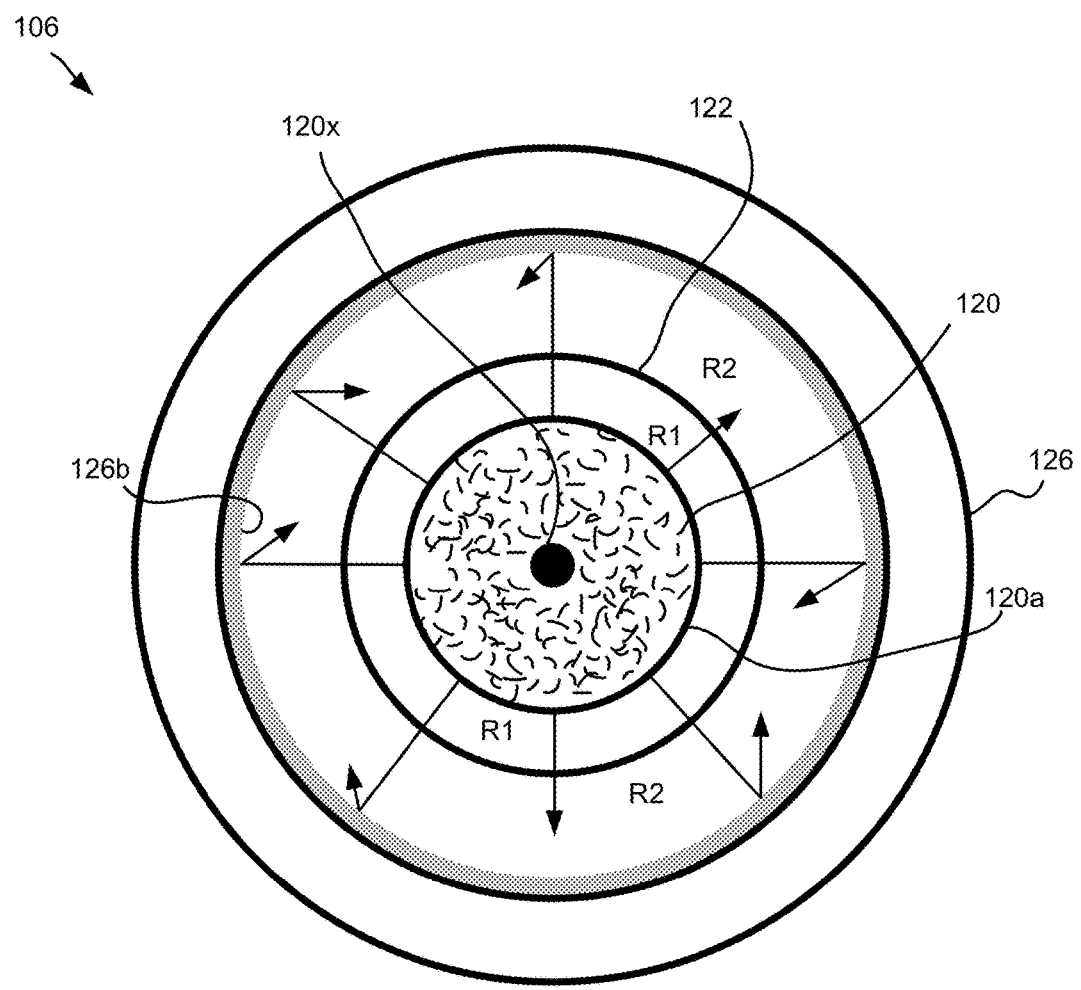
FIG. 3 illustrates a simplified cross-sectional view of an ammonia radical generator, in accordance with an example embodiment.

FIG. 3 illustrates a simplified cross-sectional view of an ammonia radical generator, in accordance with an example embodiment. As shown in FIG. 3, UV bulb 120, separator wall 122, and housing 126 are coaxially aligned with central axis 120x. A first region R1 is defined between the surface 120a of UV bulb 120 and the separator wall 122. A second region R2 is defined between the separator wall 122 and the inner surface 126b of housing 126. In one embodiment, the separator wall 122 has a cylindrical configuration that forms a cooling tube that surrounds the UV bulb 120. In one embodiment, the second region R2 is a cylindrical plenum.

The UV energy from UV bulb 120 emanates axisymmetrically from the bulb around central axis 120x (as indicated by the arrows in FIG. 3). Cooling gas (e.g., $N_2$) flows in the first region R1 and the source gas (e.g., ammonia) flows in the second region R2. The UV energy from UV bulb 120 passes through the curtain of cooling gas in region R1 as well as the separator wall 122 and enters the second region R2. A portion of the ammonia gas stream flowing through the second region R2 interacts with and absorbs UV energy and this absorbed energy causes the ammonia gas to break up into NH* radicals and $H_2$, as discussed above. The portion of the UV energy that is not absorbed by the ammonia gas stream reaches the inner surface 126b of the housing 126 and is reflected back into the ammonia gas stream because the inner surface is reflective. As such, the reflective inner surface 126b of the housing 126 increases the efficiency of the generator 106 by providing a second opportunity for the UV energy to be absorbed by the ammonia gas stream.

In an alternate embodiment, the radical generator can be constructed to operate without use of a cooling gas. In such a configuration, the chamber can be constructed without the separator wall 122. For example, if the efficiency of the UV bulb 120 is optimized for the processing, the UV bulb 120 may not generate or absorb heat, avoiding any temperature elevation or excessive temperature elevations. In one example, if the UV bulb 120 was defined from a sapphire material or sapphire coating, the UV bulb 120 would either not heat or not heat to levels that would be detrimental to the gas processing, e.g., to generate radicals. It should be understood that sapphire is just one example material, and other materials can be selected and/or optimized for processing specific chemistry gases. Thus, if the separator wall 122 is not implemented, the cooling gas is also not implemented.

Figure 4:
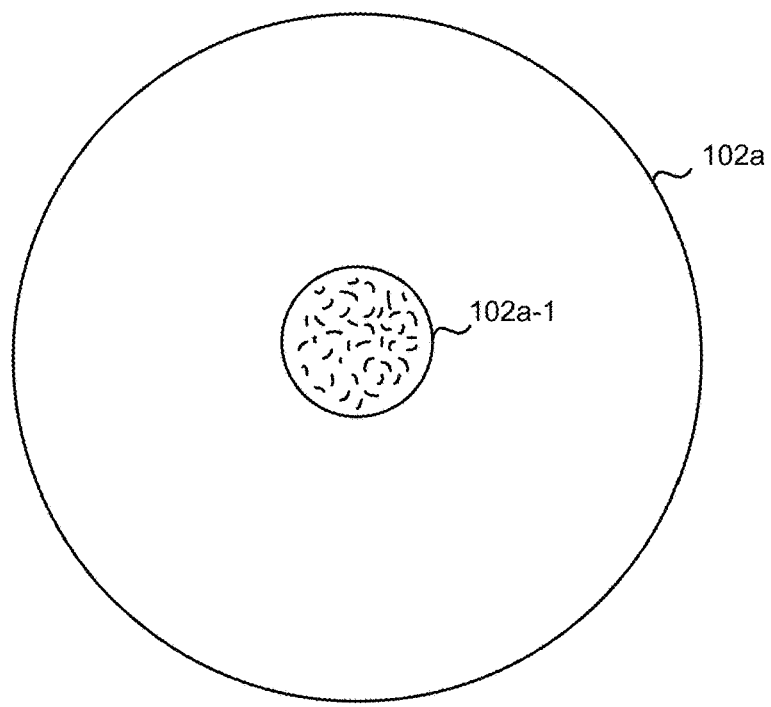
FIG. 4 illustrates a simplified view of the underside of a chamber lid, in accordance with an example embodiment.

FIG. 4 illustrates a simplified view of the underside of a chamber lid, in accordance with an example embodiment. As shown in FIG. 4, chamber lid 102a has a single opening 102a-1 formed in the central portion of the chamber lid. In one embodiment, the opening 102a-1 has a circular configuration and is located in the center of chamber lid 102a. The opening 102a-1 enables the gas mix of NH* radicals and $H_2$ exiting from an ammonia radical generator 106 mounted on the topside of chamber lid 102a (see, for example, FIG. 1) to flow into the processing region of a chamber, e.g., chamber 102 shown in FIG. 1. A chamber configured to accommodate a single ammonia radical generator is suitable for carrying out processing that does not require a precise level of uniformity, e.g., low energy pretreatments for copper oxidation.

Figure 5:
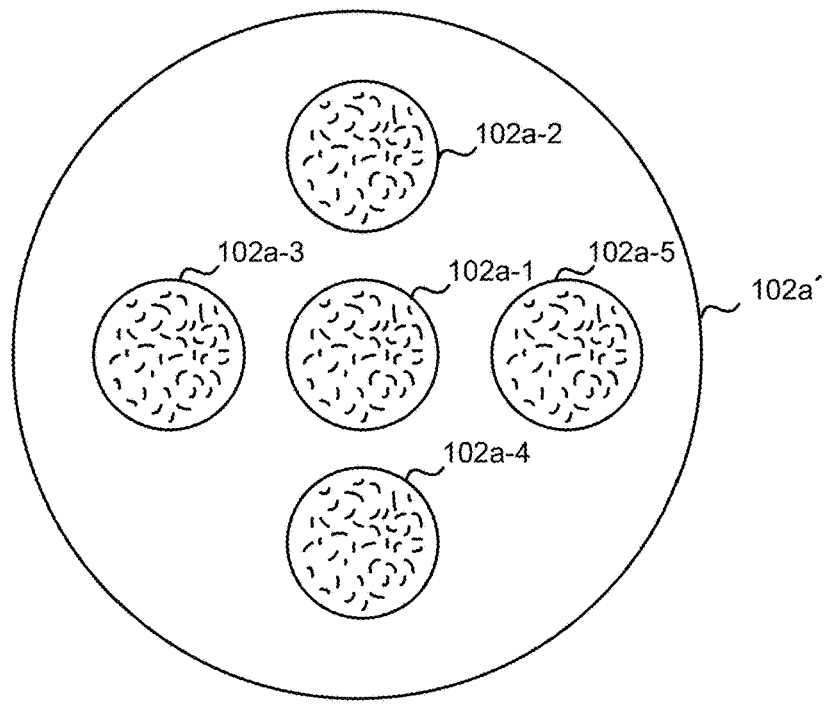
FIG. 5 illustrates a simplified view of the underside of a chamber lid, in accordance with another example embodiment.

FIG. 5 illustrates a simplified view of the underside of a chamber lid, in accordance with another example embodiment. As shown in FIG. 5, chamber lid 102a' has an opening 102a-1 formed in the central portion of the chamber lid and four additional openings 102a-2, 102a-3, 102a-4, and 102a-5 symmetrically disposed about opening 102a-1. It will be appreciated by those skilled in the art that the number of additional openings can be varied to be higher or lower than four to meet the needs of specific processing applications. In one embodiment, the opening 102a-1 has a circular configuration and is located in the center of chamber lid 102a'. In one embodiment, each of the openings 102a-2, 102a-3, 102a-4, and 102a-5 has a circular configuration and these openings are disposed about central opening 102a-1 at 90-degree intervals. The openings 102a-1 thru 102a-5 enable the gas mix of NH* radicals and $H_2$ exiting from each of the corresponding ammonia radical generators mounted on the topside of a chamber lid to flow into the processing region of a chamber. A chamber configured to accommodate multiple ammonia radical generators is suitable for carrying out processing that requires a more precise level of uniformity, e.g., a low energy deposition process.

As noted, the illustration of FIG. 5 is a top view of a chamber, showing the interface location where multiple radical generators are to be connected. For example, the multiple radical generators can define an array of generators. It should be understood that the number of radical generators can vary to more or less than what is shown in FIG. 5, and the positioning can also vary to be more symmetric or non-symmetric. In some embodiments, radical generators can be connected to an interface chamber. The interface chamber may couple to the array of radical generators on one side and the other side can interface to the chamber lid or some chamber surface. It should also be understood that an array of radical generators may be placed on different surfaces of a chamber, not just the chamber lid. These constructions will depend on the desired result, the performance desired and/or processing requirements.

Figure 6:
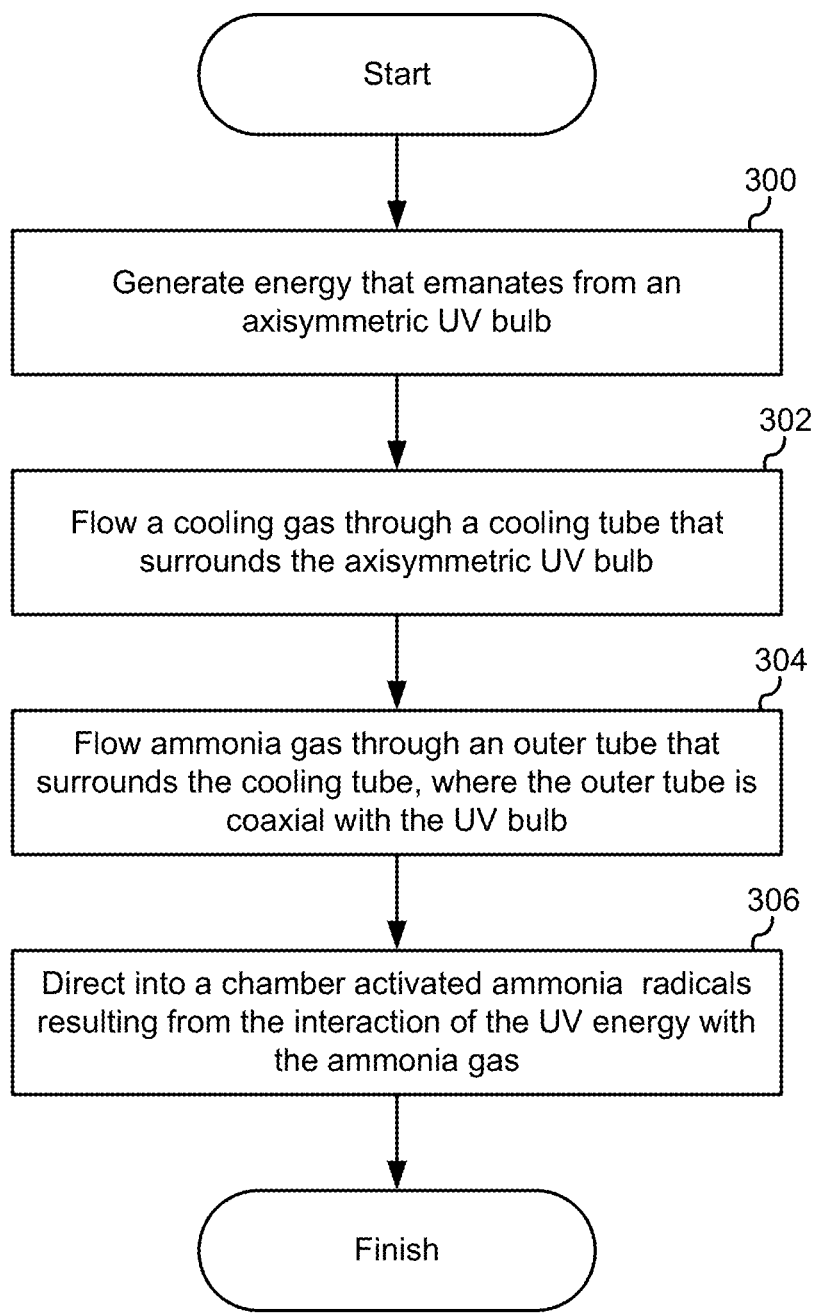
FIG. 6 is a flowchart diagram that illustrates the method operations performed in generating activated ammonia radicals, in accordance with an example embodiment.

FIG. 6 is a flowchart diagram that illustrates the method operations performed in generating activated ammonia radicals, in accordance with an example embodiment. Operation 300 includes generating ultraviolet (UV) energy that emanates from an axisymmetric UV bulb. In one embodiment, the UV bulb has a cylindrical configuration as shown in FIG. 1 (see UV bulb 120). Operation 302 includes flowing a cooling gas through a cooling tube that surrounds the axisymmetric UV bulb. By way of example, the separator wall 122 shown in FIGS. 2 and 3 can be used as the cooling tube when the separator wall has a cylindrical configuration. In one embodiment, the cooling tube is formed of a solid material that is transparent to UV energy, e.g., quartz. In one embodiment, the cooling gas is dry nitrogen.

Operation 304 includes flowing ammonia gas through an outer tube that surrounds the cooling tube. The outer tube and the UV bulb are arranged so that the outer tube is coaxial with the UV bulb. In one embodiment, the outer tube is made of stainless steel and has a reflective inner surface. By way of example, the housing 126, which has an inner surface 126 that is reflective (see, for example, FIG. 2), can be used as the outer tube that surrounds the cooling tube. Operation 306 includes directing into a chamber the activated ammonia radicals resulting from the interaction of the UV energy with the ammonia gas. As discussed above, when the UV energy interacts with the ammonia gas, the ammonia breaks up into a gas mix that includes ammonia radicals (NH*) and diatomic hydrogen ($H_2$). In one embodiment, the activated ammonia radicals (and the hydrogen) are directed into the chamber through an outlet that is disposed in an opening formed in a chamber lid of the chamber. Once they have been directed into the chamber, the activated ammonia radicals can be used in the chamber to process a semiconductor substrate (e.g., a low energy pretreatment for copper oxidation, a low energy deposition, etc.).

In the example embodiments described herein, a cooling gas is used to control the temperature of the UV bulb. It is to be understood, however, that use of a cooling gas is optional. Thus, the use of the cooling gas can be omitted. In situations where a cooling gas is not used, those skilled in the art will appreciate that the separator wall (reference number 122 in FIGS. 2 and 3) or the cooling tube (referred to in operation 302 of FIG. 6) can also be omitted.

Further, in the example embodiments described herein, ammonia is used as the source to generated a gas mix including activated ammonia radicals (NH*) and hydrogen. It will be appreciated by those skilled in the art that other source gases can be used to generate other desired chemistries through interaction with UV energy. By way of example, hydrogen fluoride (HF) vapor can be used to generate fluorine, alcohol can be used to generate C—O—H hydroxyl groups, and oxygen ($O_2$) can be used to generate ozone ($O_3$).

Figure 7:
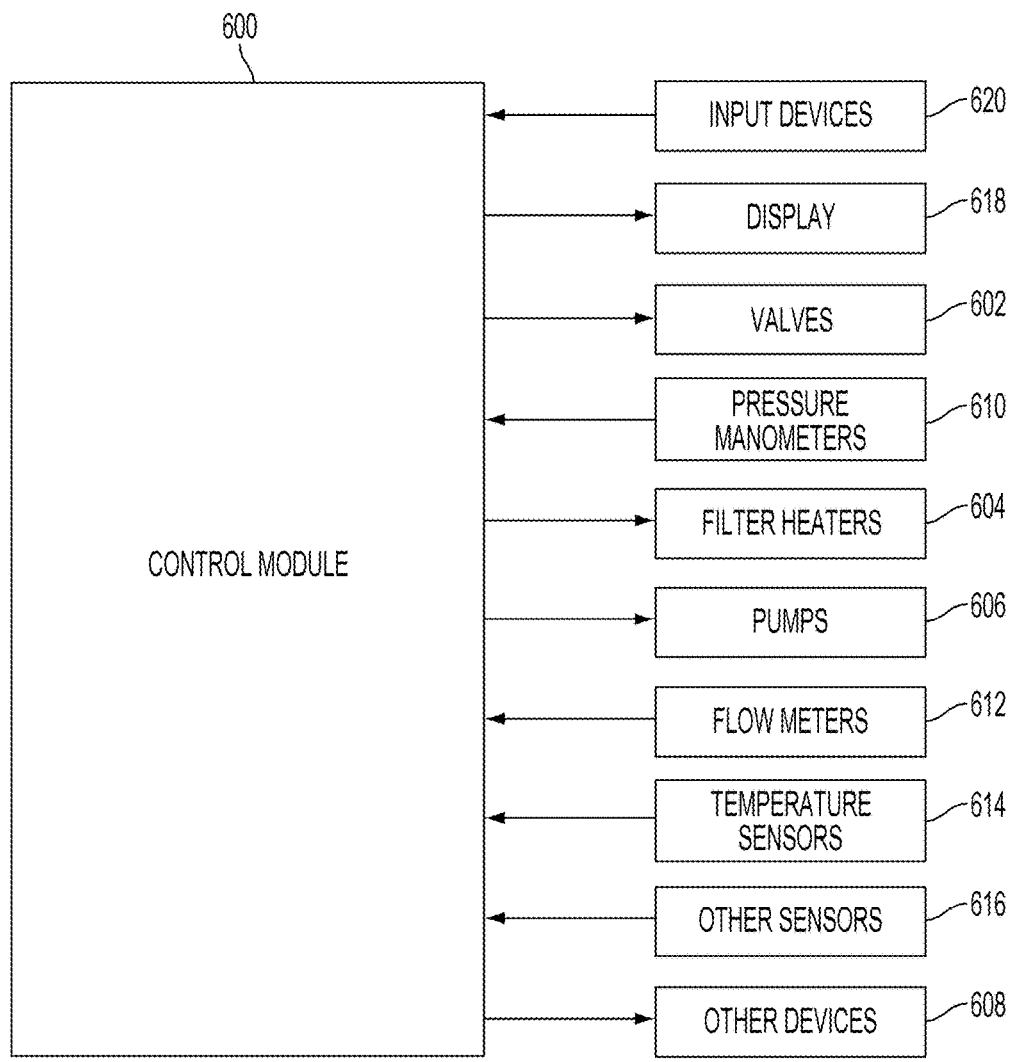
FIG. 7 is a block diagram that shows a control module for controlling a substrate processing system.

FIG. 7 is a block diagram that shows a control module 600 for controlling the systems described above. In one embodiment, the controller 114 of FIG. 1 may include some of the example components. For instance, the control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g., a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 610, and thermocouples located in delivery system, the pedestal or chuck (e.g., the temperature sensors 614). Appropriately programmed feedback and control algorithms may be used with data from these sensors to maintain desired process conditions. The foregoing describes implementation of embodiments of the invention in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling operation thereof before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Accordingly, the disclosure of the example embodiments is intended to be illustrative, but not limiting, of the scope of the disclosures, which are set forth in the following claims and their equivalents. Although example embodiments of the disclosures have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

What is claimed is:

1. A generator for processing gases to be delivered to a process chamber used to process a semiconductor substrate, comprising,
    a housing enclosing an internal volume, the housing having a length and an internal major dimension;
    an ultraviolet (UV) bulb disposed within the internal volume of the housing and extending along the length of the housing, the UV bulb having a bulb diameter that fits within the internal major dimension of the housing;
    a first region surrounding the UV bulb, the first region defined to channel a first gas around the UV bulb from an inlet situated proximate to an upper portion of the UV bulb to an outlet situated proximate to a lower portion of the UV bulb to control a temperature of the UV bulb; and
    a second region surrounding the first region, the second region extending along the length of the housing and within the internal major dimension of the housing, the second region being configured to channel a second gas between an input to the housing defined in an upper portion of the housing and an output from the housing defined in a bottom portion of the housing without any obstruction to flow of the second gas between the input and the output, wherein the second region is oriented relative to the UV bulb such that UV energy from the UV bulb interacts with the second gas as the second gas flows through the second region, the interaction of the UV energy with the second gas resulting in the generation of a gas mix that is supplied from the output of the housing into the process chamber, and wherein at least one component of the gas mix is to be used in processing of the semiconductor substrate.

2. The generator of claim 1, wherein the first region is defined between a surface of the UV bulb and a separator wall.

3. The generator of claim 2, wherein the separator wall is formed of a material that is substantially transparent to UV energy.

4. The generator of claim 2, wherein the separator wall is comprised of quartz.

5. The generator of claim 1, wherein the second region is defined between the separator wall and an inner surface of a housing wall.

6. The generator of claim 5, wherein the inner surface of the housing wall is a reflective surface.

7. The generator of claim 1, further comprising:
    a lamp controller coupled to the housing and connected to the UV bulb, the lamp controller providing operational control of the UV bulb in response to instruction received from a controller.

8. The generator of claim 1, wherein the first gas is a cooling gas.

9. The generator of claim 1, wherein the second gas is ammonia.

10. The generator of claim 9, wherein the interaction of the UV energy with ammonia results in a gas mix including activated ammonia radicals.

11. The generator of claim 1, wherein the housing of the generator is disposed on a lid of the process chamber such that a path is defined from the output of the housing to a processing region of the process chamber.

12. The generator of claim 1, wherein the internal major dimension of the housing is a diameter defined by an inner surface of a housing wall, wherein the UV energy radiates away from a central axis of the UV bulb in axisymmetric fashion toward the inner surface of the housing wall, and wherein a circle defined by the inner surface of the housing wall has a central axis that is the same as the central axis of the UV bulb.

13. A generator for processing gases to be delivered to a process chamber used to process a semiconductor substrate, comprising,
    a housing enclosing an internal volume, the housing having a length and an internal major dimension;
    an ultraviolet (UV) bulb disposed within the internal volume of the housing and extending along the length of the housing, the UV bulb having a bulb diameter that fits within the internal major dimension of the housing;

a first region surrounding the UV bulb, the first region defined to channel a cooling gas around the UV bulb from an inlet situated proximate to an upper portion of the UV bulb to an outlet situated proximate to a lower portion of the UV bulb to control a temperature of the UV bulb; and a second region surrounding the first region, the second region extending along the length of the housing and within the internal major dimension of the housing, the second region being configured to channel an ammonia ($NH_3$) gas between an input to the housing defined in an upper portion of the housing and an output from the housing defined in a bottom portion of the housing without any obstruction to flow of the ammonia gas between the input and the output, wherein the second region is oriented relative to the UV bulb such that UV energy from the UV bulb interacts with the ammonia gas as the ammonia gas flows through the second region, the interaction of the UV energy with the ammonia gas resulting in the generation of a gas mix that is supplied from the output of the housing into the process chamber, the gas mix including activated ammonia radicals (NH*) to be used in processing of the semiconductor substrate.

14. The generator of claim 13, wherein the cooling gas is dry nitrogen.

15. The generator of claim 13, wherein the second region is defined between a separator wall and an inner surface of a housing wall, and wherein the inner surface of the housing wall is a reflective surface.

16. A method, comprising:

generating ultraviolet (UV) energy that emanates from an axisymmetric UV bulb;

flowing a cooling gas through a cooling tube that surrounds the axisymmetric UV bulb, the cooling gas flowing from an inlet of the cooling tube situated proximate to an upper portion of the UV bulb to an outlet of the cooling tube situated proximate to a lower portion of the UV bulb;

flowing ammonia gas through an outer tube that surrounds the cooling tube, wherein the outer tube is coaxial with the axisymmetric UV bulb, the ammonia gas flowing from an inlet defined in an upper portion of a housing to an outlet defined in a bottom portion of the housing without any obstruction to flow of the ammonia gas between the input and the output; and directing from the output of the housing into a chamber activated ammonia radicals resulting from the interaction of the UV energy with the ammonia gas.

17. The method of claim 16, wherein the cooling tube is substantially transparent to UV energy.

18. The method of claim 16, wherein the cooling tube is comprised of quartz.

19. The method of claim 16, further comprising:

reflecting UV energy that reaches an inner surface of the outer tube back into the flowing ammonia gas.

20. The method of claim 16, wherein the cooling gas is dry nitrogen.

21. A generator for processing gases to be delivered to a process chamber used to process a semiconductor substrate, comprising, a housing enclosing an internal volume, the housing having a first dimension and an internal dimension;

an ultraviolet (UV) bulb disposed within the internal volume of the housing and extending along the first dimension of the housing, the UV bulb having a bulb diameter that fits within the internal dimension of the housing;

a region surrounding the UV bulb, the region extending along the first dimension of the housing and within the internal dimension of the housing, the region being configured to channel a gas between an input to the housing defined in an upper portion of the housing and an output from the housing defined in a bottom portion of the housing without any obstruction to flow of the gas between the input and the output, wherein the region is oriented relative to the UV bulb such that UV energy from the UV bulb interacts with the gas as the gas flows through the region, the interaction of the UV energy with the gas resulting in the generation of a gas mix that is supplied from the output of the housing into the process chamber, and wherein at least one component of the gas mix is to be used in processing of the semiconductor substrate.

22. The generator of claim 21, further comprising:

an intermediate region surrounding the UV bulb, the intermediate region being defined to channel a cooling gas around the UV bulb to control a temperature of the UV bulb.

23. The generator of claim 21, wherein the first dimension is a length, and the internal dimension is an internal major dimension.

* * * * *